United States Patent
Nakamura et al.

(10) Patent No.: US 9,698,755 B2
(45) Date of Patent: Jul. 4, 2017

(54) SURFACE ACOUSTIC WAVE DEVICE AND FILTER

(71) Applicant: TAIYO YUDEN CO., LTD., Tokyo (JP)

(72) Inventors: Kentaro Nakamura, Tokyo (JP); Hidetaro Nakazawa, Tokyo (JP); Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 140 days.

(21) Appl. No.: 14/667,316

(22) Filed: Mar. 24, 2015

(65) Prior Publication Data
US 2015/0280689 A1    Oct. 1, 2015

(30) Foreign Application Priority Data
Mar. 26, 2014    (JP) .................. 2014-064281

(51) Int. Cl.
*H03H 9/145* (2006.01)
*H03H 9/25* (2006.01)
(Continued)

(52) U.S. Cl.
CPC .......... *H03H 9/02818* (2013.01); *H03H 3/10* (2013.01); *H03H 9/02834* (2013.01);
(Continued)

(58) Field of Classification Search
CPC .......... H03H 9/02818; H03H 9/02834; H03H 9/02992; H03H 3/10; H03H 9/02858;
(Continued)

(56) References Cited

U.S. PATENT DOCUMENTS 5,757,250 A * 5/1998 Ichikawa ............ H03H 3/10
310/313 A
7,109,828 B2 * 9/2006 Takayama ........ H03H 9/02661
310/312
(Continued)

FOREIGN PATENT DOCUMENTS

JP    57-097215 A  *  6/1982
JP    08-032397 A  *  2/1996
(Continued)

OTHER PUBLICATIONS

English language machine translation of JP 10-022765, published Jan. 23, 1998, 3 pages.*

*Primary Examiner* — Barbara Summons
(74) *Attorney, Agent, or Firm* — Chen Yoshimura LLP

(57) ABSTRACT

A surface acoustic wave device includes: comb electrodes that are provided on a piezoelectric substrate, respectively has a plurality of electrode fingers, a plurality of dummy electrode fingers and a bus bar, edges of the electrode fingers of one of the comb electrodes facing the dummy electrode fingers of the other; and an added film that is provided at least under the bus bar of the comb electrodes and under the electrode fingers and the dummy electrode fingers in a first region and is not provided in a crossing region where the electrode fingers of the one of the comb electrodes and the electrode fingers of the other cross each other, the first region being a region between front edges of the dummy electrodes and edges of the dummy electrodes connected to the bus bar and extending in an alignment direction of the electrode fingers.

10 Claims, 14 Drawing Sheets

(51) Int. Cl.
*H03H 9/64* (2006.01)
*H03H 9/02* (2006.01)
*H03H 3/10* (2006.01)

(52) U.S. Cl.
CPC .... *H03H 9/02881* (2013.01); *H03H 9/02992* (2013.01); *H03H 9/14541* (2013.01); *H03H 9/6489* (2013.01)

(58) Field of Classification Search
CPC .......... H03H 9/02881; H03H 9/02889; H03H 9/14541; H03H 9/64; H03H 9/6483; H03H 9/6489
USPC .................. 333/193–196; 310/313 B, 313 D
See application file for complete search history.

(56) References Cited

U.S. PATENT DOCUMENTS

| 7,453,334 B1* | 11/2008 | Abbott ............... H03H 9/02543 310/313 B |
| 2003/0117240 A1* | 6/2003 | Inoue ................. H03H 9/14567 333/195 |
| 2004/0251990 A1 | 12/2004 | Ueda et al. |
| 2013/0249647 A1* | 9/2013 | Nakanishi .......... H03H 9/02559 333/186 |
| 2014/0001919 A1* | 1/2014 | Komatsu ............ H03H 9/02818 310/313 B |

FOREIGN PATENT DOCUMENTS

| JP | 10-022765 A | * | 1/1998 |
| JP | 2004-328196 A | | 11/2004 |
| JP | 2009-278429 A | | 11/2009 |
| WO | WO 2012/127793 A1 | * | 9/2012 |

\* cited by examiner

FIRST DIRECTION
SECOND DIRECTION

SURFACE ACOUSTIC WAVE DEVICE AND FILTER

CROSS-REFERENCE TO RELATED APPLICATION

This application is based upon and claims the benefit of priority of the prior Japanese Patent Application No. 2014-064281, filed on Mar. 26, 2014, the entire contents of which are incorporated herein by reference.

FIELD

A certain aspect of the present invention relates to a surface acoustic wave device and a filter, and in particular, relates to a surface acoustic wave device and a filter that have a comb electrode in which a plurality of electrode fingers and a plurality of dummy electrode fingers are connected to a bus bar.

BACKGROUND

There are known surface acoustic wave (SAW) devices that have an IDT (Interdigital Transducer) having a pair of comb electrodes on a piezoelectric substrate, as acoustic wave devices using an acoustic wave. The SAW devices are used for band pass filters of wireless communication devices that process a wireless signal in a frequency band of 45 MHz to 2 GHz, as presented by mobile phones. Recently, as performance of wireless communication devices are enhanced (for example, multi-band or multi-mode), low loss of filters are demanded in order to improve receiving sensitivity or reduce power consumption. Factors of the loss of the SAW devices are such as a leakage of an acoustic wave in an opening length direction, a leakage of an acoustic wave in a propagating direction, a loss of conversion from an acoustic wave to a bulk wave, a resistance loss of a comb electrode.

Various SAW devices are supposed in order to reduce a loss of a filter. For example, there are supposed SAW devices that have a structure in which an insulating material is buried between an edge of an electrode finger and an edge of a dummy electrode finger (see Japanese Patent Application Publication No. 2009-278429). There are supposed SAW devices that have a structure in which a part of a bus bar is thicker than an electrode finger (see Japanese Patent Application Publication No. 2004-328196).

However, conventional SAW devices cannot reduce a loss sufficiently. There is a room for improvement.

SUMMARY OF THE INVENTION

According to an aspect of the present invention, there is provided a surface acoustic wave device comprising: a pair of comb electrodes that are provided on a piezoelectric substrate, respectively has a plurality of electrode fingers, a plurality of dummy electrode fingers and a bus bar to which the plurality of the electrode fingers and the plurality of the dummy electrodes are connected, edges of the plurality of the electrode fingers of one of the comb electrodes facing the plurality of the dummy electrode fingers of the other; and an added film that is provided at least under the bus bar of the pair of the comb electrodes and under the plurality of the electrode fingers and the plurality of the dummy electrode fingers in a first region and is not provided in a crossing region where the plurality of the electrode fingers of the one of the comb electrodes and the plurality of the electrode fingers of the other cross each other, the first region being a region between front edges of the plurality of the dummy electrodes and edges of the plurality of the dummy electrodes connected to the bus bar and extending in an alignment direction of the plurality of the electrode fingers.

DETAILED DESCRIPTION

A description will be given of embodiments with reference to drawings.

First Embodiment

Figure 1A:
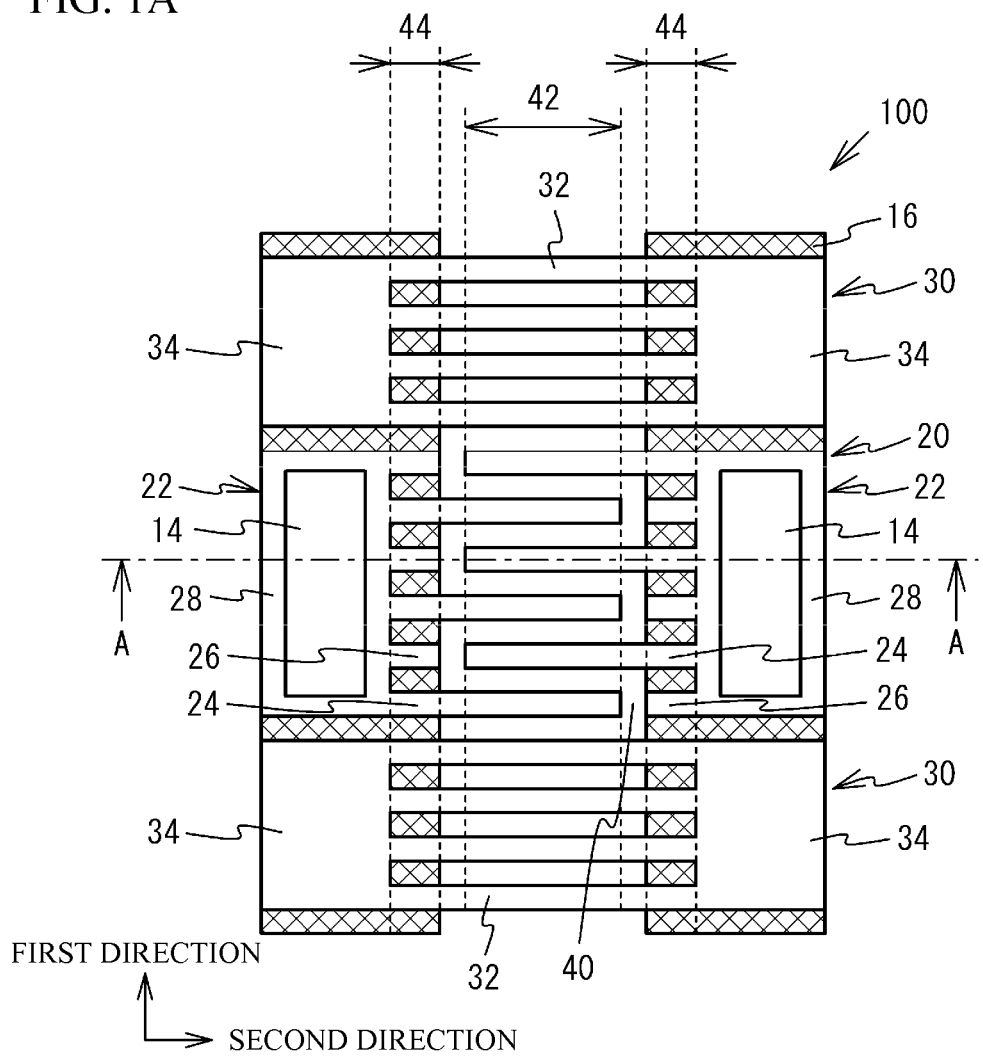
FIG. 1A illustrates a top view of a SAW device in accordance with a first embodiment.
Figure 1B:
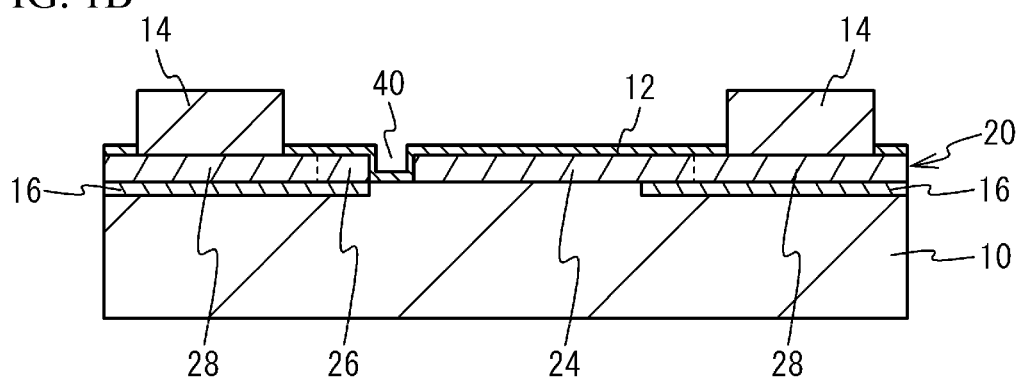
FIG. 1B illustrates a cross sectional view taken along a line A-A of FIG. 1A.

FIG. 1A illustrates a top view of a SAW device in accordance with a first embodiment. FIG. 1B illustrates a cross sectional view taken along a line A-A of FIG. 1A. In FIG. 1A, a protective film 12 is seen through. As illustrated in FIG. 1A and FIG. 1B, a SAW device 100 of the first embodiment has an IDT 20 and reflectors 30 on a piezoelectric substrate 10. The reflectors 30 are provided on both sides of the IDT 20 in a propagation direction of a surface acoustic wave. The piezoelectric substrate 10 is made of a piezoelectric material such as lithium niobate ($LiNbO_3$) or lithium tantalate ($LiTaO_3$). The IDT 20 and the reflectors 30 are made of a metal such as aluminum (Al) or copper (Cu).

The IDT 20 and the reflector 30 may be a single-layer metal film such as aluminum (Al) or copper (Cu) or may be a lamination metal film in which a metal such as titanium (Ti) or chromium (Cr) are provided under a metal such as aluminum (Al) or copper (Cu).

The IDT 20 has a pair of comb electrodes 22. The pair of the comb electrodes 22 respectively have a plurality of electrode fingers 24, a plurality of dummy electrode fingers 26 and a bus bar 28 to which the plurality of the electrode fingers 24 and the plurality of the dummy electrode fingers 26 are connected. The reflectors 30 have a plurality of electrode fingers 32 and a pair of bus bars 34 to which both edges of the plurality of the electrode fingers 32 are connected.

In each of the comb electrodes 22, for example, the electrode finger 24 and the dummy electrode finger 26 are alternately arranged. Each of the electrode fingers 24 of the pair of the comb electrodes 22 is, for example, alternately arranged. Edges of the plurality of the electrode fingers 24 and edges of the plurality of the dummy electrode fingers 26 of the pair of the comb electrodes 22 face each other. Clearances 40 are formed between the edges of the plurality of the electrode fingers 24 and the edges of the corresponding plurality of the dummy electrode fingers 26.

In the following, an arraying direction of the plurality of the electrode fingers 24 is a first direction. An extending direction of the electrode fingers 24 is a second direction. A region where the electrode fingers 24 of the pair of the comb electrodes 22 cross with each other is referred to as a crossing region. An extending region of the crossing region in the first direction is referred to as a crossing extension region 42. A region between front edges of the dummy electrode fingers 26 and the edges connected to the bus bars 28 of the dummy electrode fingers 26 that is extended in the first direction is referred to as a first region 44.

The protective film 12 covers the IDT 20 and the reflector 30 except for a part of the bus bars 28 of the pair of the comb electrodes 22. The protective film 12 is made of a dielectric film such as a silicon oxide ($SiO_2$) film, an aluminum oxide ($Al_2O_3$) film, or a silicon nitride (SiN) film. A thickness of the protective film 12 is, for example, 10 nm to 100 nm. A metal film 14 is provided on a region of the bus bars 28 not covered by the protective film 12. The metal film 14 is a lamination metal film of titanium (Ti) and gold (Au), for example.

Added films 16 made of a material such as a dielectric film that is different from the piezoelectric substrate 10 are provided in regions below the IDT 20 and the reflector 30 other than the crossing extension region 42. The added film 16 is buried in a recess formed on an upper face of the piezoelectric substrate 10. The added film 16 is provided between the front edge of the dummy electrode finger 26 and the edge of the bus bar 28 that is opposite to the side where the dummy electrode finger 26 is connected, and extends from one of a pair of the reflectors 30 to the other in the first direction. Therefore, the added film 16 is provided under the bus bar 28 of each of the pair of the comb electrodes 22 and under the bus bar 34 of each of the pair of the reflectors 30. The added film 16 is provided under the electrode fingers 24 and the dummy electrode fingers 26 of the comb electrode 22 of the first region 44 and under the electrode fingers 32 of the reflector 30. The added film 16 is in touch with the lower face of the comb electrodes 22 and the lower face of the reflector 30.

Figure 2A:
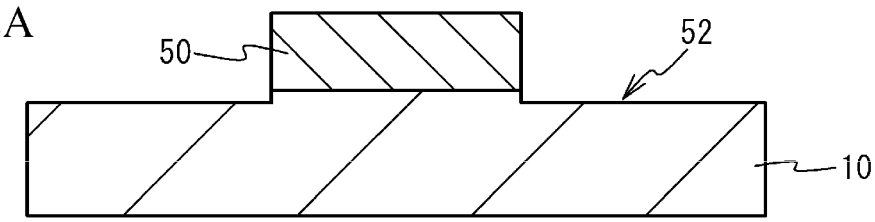
FIG. 2A to FIG. 2E illustrate a cross sectional views describing a manufacturing method of a SAW device of a first embodiment.

Next, a description will be given of a manufacturing method of the SAW device of the first embodiment. FIG. 2A to FIG. 2E illustrate cross sectional views for describing the manufacturing method of the SAW device of the first embodiment. As illustrated in FIG. 2A, a resist pattern 50 having an opening in a region where the added film 16 is to be formed is formed on the piezoelectric substrate 10. The piezoelectric substrate 10 is subjected to an etching with use of the resist pattern 50 as a mask. Thus, a recess 52 is formed on the upper face of the piezoelectric substrate 10. A dry etching such as an ion milling can be used as the etching of the piezoelectric substrate 10.

Figure 2B:
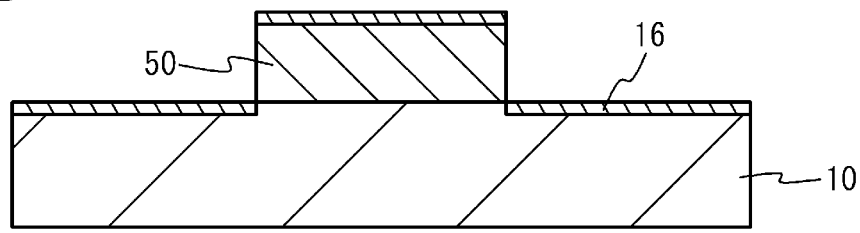

As illustrated in FIG. 2B, the added film 16 is formed on the piezoelectric substrate 10 by a vapor deposition method or the like under a condition that the resist pattern 50 is provided. The added film 16 is formed on the resist pattern 50 and is buried in the recess 52 formed on the upper face of the piezoelectric substrate 10. In this case, it is preferable that an etching amount of the recess 52 and a formation amount of the added film 16 are adjusted so that there is little gap between the upper face of the added film 16 buried in the recess 52 and the upper face of the piezoelectric substrate 10 under the resist pattern 50.

Figure 2C:
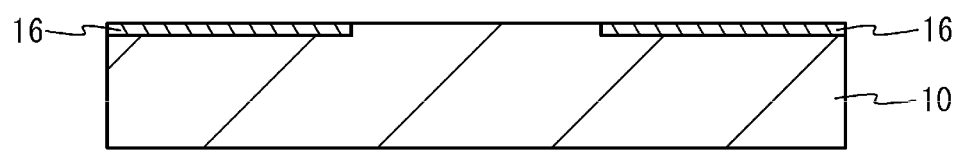

As illustrated in FIG. 2C, the resist pattern 50 and a part of the added film 16 formed on the resist pattern 50 are removed by a lift-off. And, the added films 16 are subjected a patterning. When the added film 16 is formed by a vapor deposition method, adherence of the added film 16 to a side wall of the resist pattern 50 can be suppressed. It is therefore easy to perform the lift-off. The added film 16 may be formed by a sputtering method instead of the vapor deposition method. In this case, it is preferable that the side wall of the resist pattern 50 has a reverse taper shape in order to suppress the adherence of the added film 16 to the side wall of the resist pattern 50. The resist pattern 50 may have a pattern shape of which side wall has a gap.

Figure 2D:
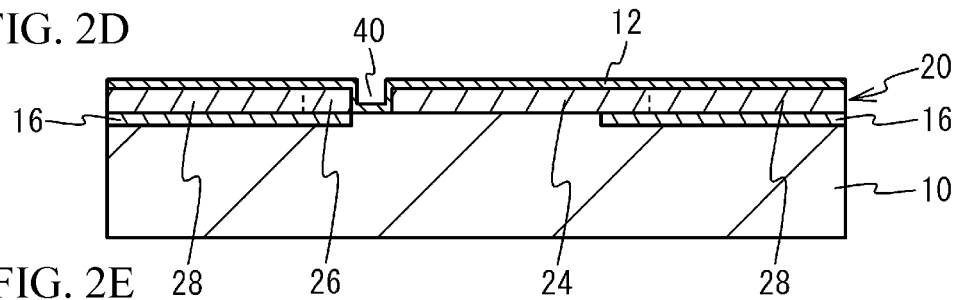

As illustrated in FIG. 2D, after forming a metal film on the piezoelectric substrate 10, the metal film is processed with use of an exposure technology and an etching technology. Thus, the IDT 20 and the reflector 30 are formed. The IDT 20 and the reflector 30 may be formed by a lift-off method. After that, the protective film 12 is deposited on the piezoelectric substrate 10 by a sputtering method or the like.

Figure 2E:
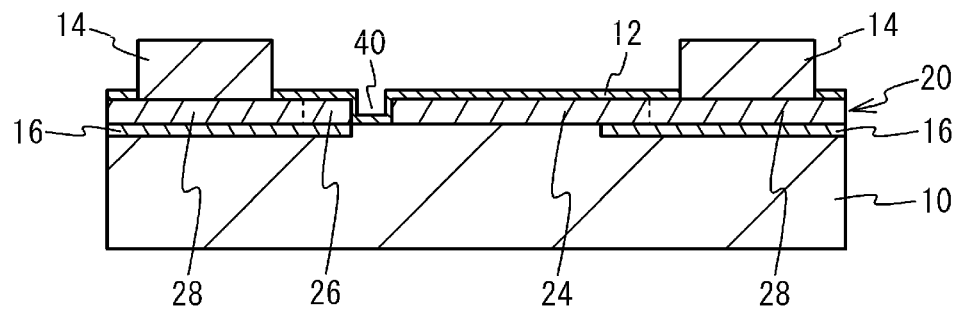

As illustrated in FIG. 2E, a part of the protective film 12 in a region where the metal film 14 is to be formed is removed by an exposure technology and an etching technology or the like. After that, the metal film 14 is formed on the bus bar 28 by a vapor deposition method and a lift-off method or the like. Thus, the SAW device of the first embodiment can be formed with the processes.

A description will be given of a simulation performed by the present inventors. The present inventors measured a Q characteristic of the SAW device of the first embodiment. Table 1 shows a concrete structure of the SAW device of the first embodiment that was subjected to the simulation.

TABLE 1

| | |
|---|---|
| piezoelectric substrate | 42° Y-X $LiTaO_3$ |
| wavelength of acoustic wave | λ |
| material and thickness of IDT | Al 0.0883 h/λ |
| material and normalized thickness of added film | $SiO_2$ 0.06 h/λ |
| number of pairs of electrode fingers | 80 |
| number of electrode fingers of reflector | 30 |
| opening length | 17.6λ |
| length of dummy electrode fingers | 2.0λ |
| duty ratio | 50% |

As shown in Table 1, the piezoelectric substrate 10 is a lithium tantalite $LiTaO_3$ substrate of 42 degrees Y-cut and X-propagation. A wavelength of an excited surface acoustic wave is λ. The IDT 20 and the reflector 30 are aluminum (Al) films having a normalized thickness of 0.0883 h/λ, in which a thickness h is normalized by the wavelength λ. The added film 16 is a silicon oxide film ($SiO_2$) having a normalized thickness of 0.06 h/λ. The number of pairs of the electrode fingers 24 of the IDT 20 is 80. The number of the electrode fingers 32 of the reflector 30 is 30. An opening length of the IDT 20 is 17.6λ. A length of the dummy electrode finger 26 is 2.0λ. A duty ratio of the IDT 20 and the reflector 30 is 50%.

Figure 3:
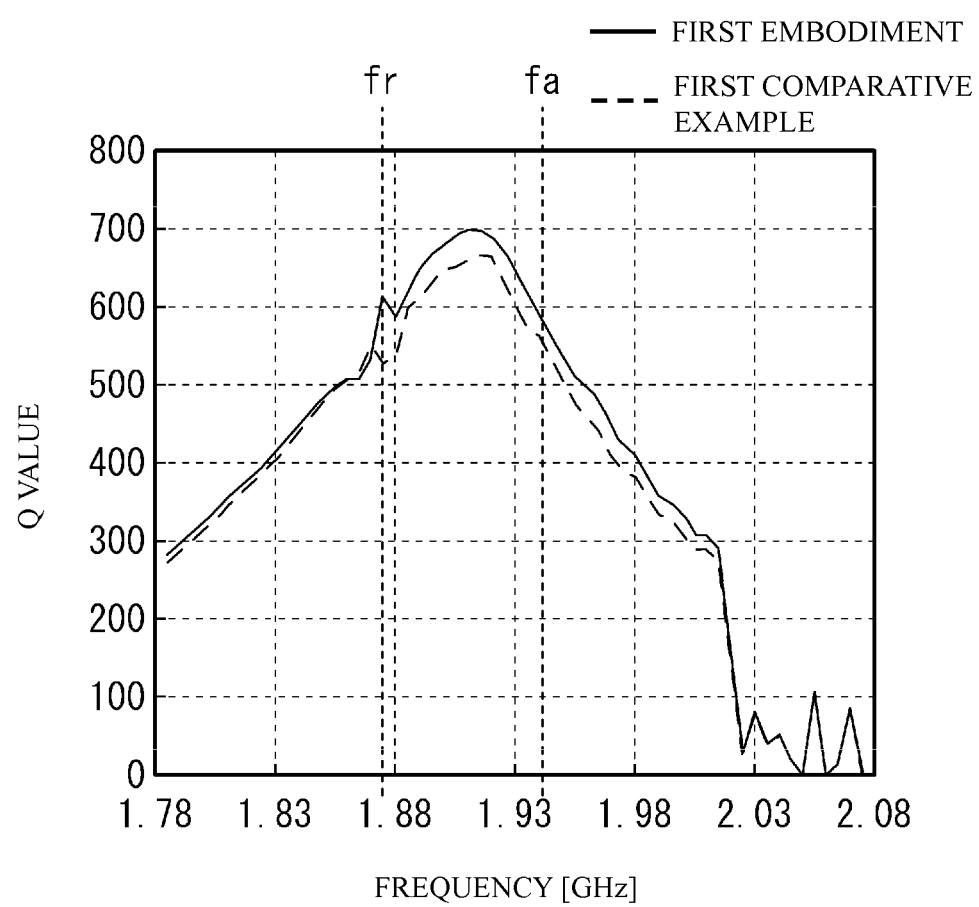
FIG. 3 illustrates a simulation result of a Q characteristic of a SAW device of a first embodiment.

FIG. 3 illustrates a simulation result of the Q characteristic of the SAW device of the first embodiment. A solid line indicates the simulation result of the SAW device of the first embodiment. For comparison, a broken line indicates a simulation result of a SAW device of a first comparative example that does not have the added film 16 and has the same structure as the first embodiment except for the added film 16. As illustrated in FIG. 3, in the first embodiment, the Q value is more improved in a wide frequency band from a resonant frequency fr to an anti-resonant frequency fa than in the first comparative example.

In this manner, the Q value of the first embodiment is more improved than the first comparative example for the following reasons. That is, in the SAW device, a surface acoustic wave propagating in the crossing region where the electrode fingers 24 of the pair of the comb electrodes 22 cross may be leaked outside of the crossing region in the opening length direction. For example, it is thought that a surface acoustic wave propagating in the crossing region as a SH wave is scattered as a Rayleigh wave to outside of the crossing region from an edge of the crossing region in the opening length direction of the electrode finger 24.

In the first embodiment, the added film 16 having a material different from the piezoelectric substrate 10 is provided under the bus bar 28 of the comb electrode 22 and under the electrode finger 24 and the dummy electrode finger 26 of the first region 44. In the region where the added film 16 is provided, sound impedance (sound speed) changes more than in the region where the added film 16 is not provided. That is, it is thought that in the region of the bus bar 28 and the electrode finger 24 and the dummy electrode finger 26 in the first region 44, the sound impedance (sound speed) changes more than in the crossing region where the electrode fingers 24 cross. The changing of the sound impedance (sound speed) suppresses the leakage of the surface acoustic wave propagating in the crossing region to outside of the crossing region in the opening length direction and the scattering of the surface acoustic wave from the edge of the crossing region in the opening length direction of the electrode finger 24 as a Rayleigh wave. It is therefore thought that the Q value is improved. It is thought that the sound impedance (sound speed) changes according to the mass load effect of the added film 16. It is therefore thought that the mass load effect of the added film 16 contributes to the improvement of the Q value.

It is therefore preferable that the added film 16 is made of a material that changes the sound impedance (sound speed) in the region where the added film 16 is provided (the region of the bus bar 28 and the region of the electrode finger 24 and the dummy electrode finger 26 in the first region 44) more than the sound impedance in the region where the added film 16 is not provided (the crossing region). For example, it is preferable that the added film 16 is made of a material that delays the sound speed in the region where the added film 16 is provided (the region of the bus bar 28 and the region of the electrode finger 24 and the dummy electrode finger 26 in the first region) more than the sound speed in the region where the added film 16 is not provided (the crossing region).

Next, the present inventors measured the pass characteristic of a ladder type filter using the SAW device of the first embodiment through a simulation. The ladder type filter subjected to the simulation is a filter of four-stage structure that has four series resonators connected in series between an input terminal and an output terminal and two parallel resonators connected in parallel between the input terminal and the output terminal. The number of pair of the electrode fingers 24 of the IDT 20 of all series resonators is 116. Other structures are the same as the SAW device of the first embodiment having the structure of Table 1. All parallel resonators are the SAW devices of the first embodiment having the structure of Table 1. Similar effect of loss improvement is achieved except for an improvement amount despite of the structure of the resonators having the structure of Table 1.

Figure 4:
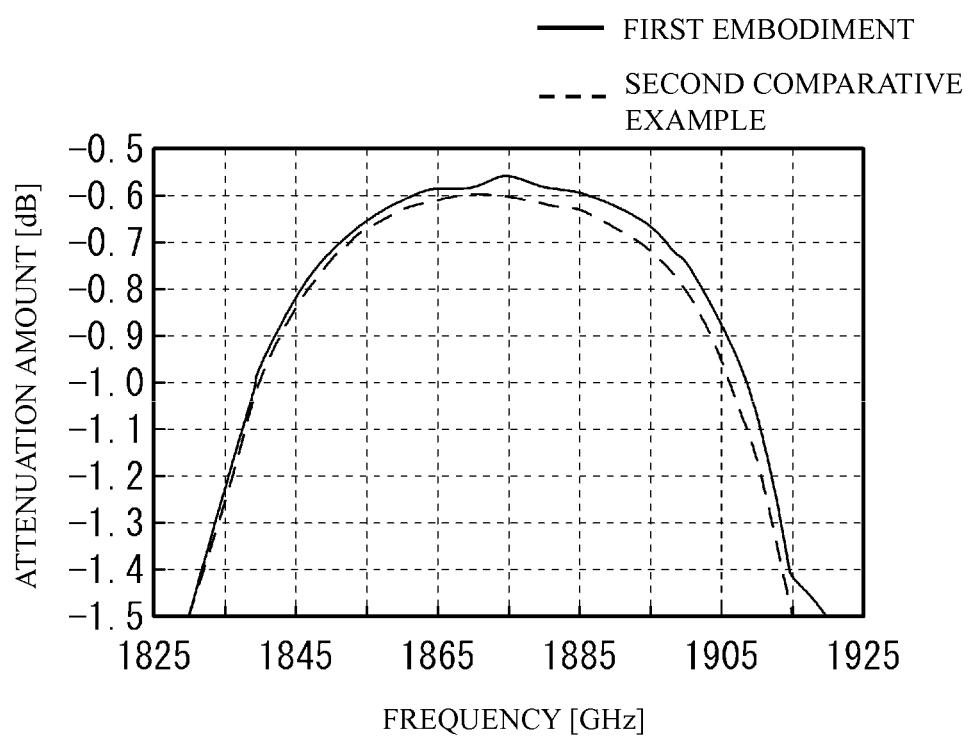
FIG. 4 illustrates a simulation result of a pass characteristic of a ladder type filter using a SAW device of a first embodiment.

FIG. 4 illustrates a simulation result of the pass characteristic of the ladder type filter using the SAW device of the first embodiment. A solid line indicates the simulation result of the ladder type filter using the SAW device of the first embodiment. For comparison, a broken line indicates a simulation result of a ladder type filter of a second comparative example that does not have the added film 16 and has the same structure as the above-mentioned ladder type filter except for the added film 16. Mismatch loss has an influence on the insertion loss. Therefore, the mismatch loss of the pass characteristic is zero (that is, there is no influence of the mismatch). The same goes for the following simulation results of the pass characteristic. As illustrated in FIG. 4, in the first embodiment, the insertion loss is more improved in an entire pass band than in the second comparative example.

In the first embodiment, as illustrated in FIG. 1A, the added film 16 made of a material different from the piezoelectric substrate 10 is provided at least under the bus bar 28 of one pair of the comb electrodes 22 and under the electrode finger 24 and the dummy electrode finger 26 of the first region 44. The added film 16 is not provided in the crossing region where the electrode fingers 24 of the one pair of the comb electrodes 22 cross each other. As mentioned above, it is therefore possible to suppress the leakage of the surface acoustic wave propagating in the crossing region to outside of the crossing region in the opening length direction. As a result, as illustrated in FIG. 3, the Q value can be improved. It is therefore possible to improve the insertion loss in the pass band as illustrated in FIG. 4, by using the SAW device of the first embodiment as the ladder type filter.

The added film 16 may be provided only in a part under the bus bar 28 of the comb electrode 22 and only in a part under the electrode finger 24 and the dummy electrode finger 26 of the first region 44. For example, a first edge of the added film 16 on the side of the crossing extension region 42 may be located closer to the bus bar 28 side than the edge of the dummy electrode finger 26, and a second edge of the added film 16 on the opposite side of the crossing extension region 42 may be located closer to the dummy electrode finger 26 side than the edge of the bus bar 28 opposite to the connection side of the dummy electrode finger 26 and may extend in the first direction. However, it is preferable that the added film 16 is provided in an entire region under the bus bar 28 of the comb electrode 22 and in an entire region under the electrode finger 24 and the dummy electrode finger 26 of the first region 44 in order to suppress the leakage of the surface acoustic wave in the opening length direction effectively. For example, it is preferable that the first edge of the added film 16 on the side of the crossing extension region 42 is located in an edge portion of the dummy electrode finger 26, and the second edge of the added film 16 opposite to the crossing extension region 42 side is located in an edge portion of the bus bar 28 opposite to the connection side of the dummy electrode finger 26 and extends in the first direction.

It is preferable that the added film 16 is also provided under the bus bar 34 of the reflectors 30 that are located on the both sides of the pair of the comb electrodes 22 in the first direction and under the electrode finger 32 of the first region 44. For example, it is preferable that the added film 16 is provided in an entire region under the bus bar 34 of the reflector 30 and in an entire region under the electrode finger 32 of the first region 44. It is therefore possible to suppress the leakage of the surface acoustic wave to outside from the crossing region and to improve the Q value more.

Figure 5:
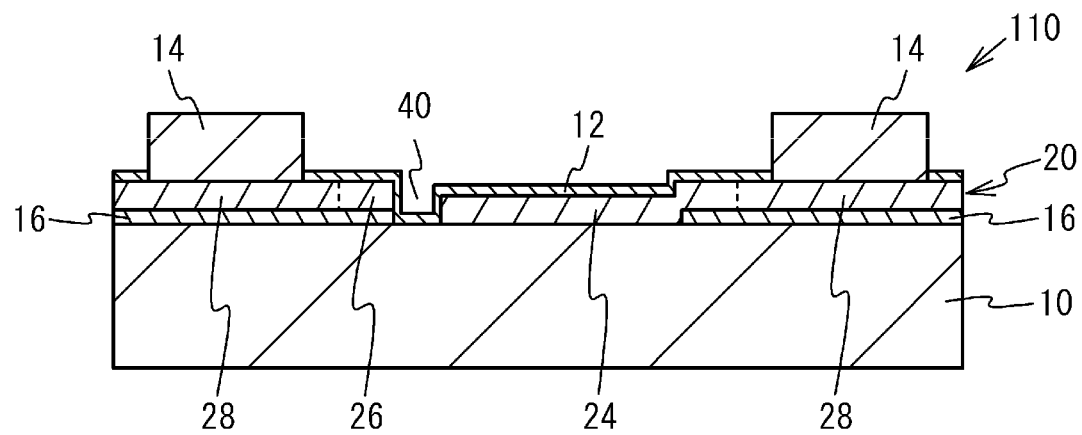
FIG. 5 illustrates a cross sectional view of a SAW device in accordance with a first modified embodiment of a first embodiment.

FIG. 5 illustrates a cross sectional view of a SAW device in accordance with a first modified embodiment of the first embodiment. As illustrated in FIG. 5, a SAW device 110 of the first modified embodiment of the first embodiment has a structure in which the upper face of the piezoelectric substrate 10 is a flat without concaves and the added film 16 is provided on the flat upper face of the piezoelectric substrate 10. That is, the added film 16 is not buried in the piezoelectric substrate 10. Other structures are the same as FIG. 1B of the first embodiment. Therefore, an explanation of the structures is omitted.

As in the case of the first modified embodiment of the first embodiment, the example in which the added film 16 is not buried in the piezoelectric substrate 10 is allowed. However, in the first modified embodiment of the first embodiment, the added film 16 causes a gap in the electrode finger 24. Therefore, a crack may occur in the gap in the electrode finger 24, and increasing of resistance or disconnection is worried about. Therefore, as in the case of FIG. 1B of the first embodiment, it is preferable that the added film 16 is buried in the recess of the upper face of the piezoelectric substrate 10.

In a case where the added film 16 is buried in the piezoelectric substrate 10, when the added film 16 is thick, the thickness of the piezoelectric substrate 10 under the added film 16 gets smaller. Therefore, deterioration of characteristic is worried about. It is therefore preferable that the added film 16 is not very thick. The recess for burying the added film 16 is formed in the piezoelectric substrate 10. It takes an etching time of approximately 80 minutes to form the recess having a depth of 1λ (such as 2 µm) by a dry etching. It is therefore preferable that the added film 16 is not very thick in terms of manufacturing. On the other hand, the energy of the surface acoustic wave is focused on a surface layer of the piezoelectric substrate 10. Therefore, even if the added film 16 buried in the piezoelectric substrate 10 is thin, the effect of suppressing the leakage of the surface acoustic wave can be expected. Therefore, it is preferable that the thickness of the added film 16 buried in the piezoelectric substrate 10 is 0.01λ or more and 0.2λ or less. It is more preferable that the thickness is 0.01λ or more and 0.15λ or less. It is much more preferable that the thickness is 0.01λ or more and 0.1λ or less.

Figure 6:
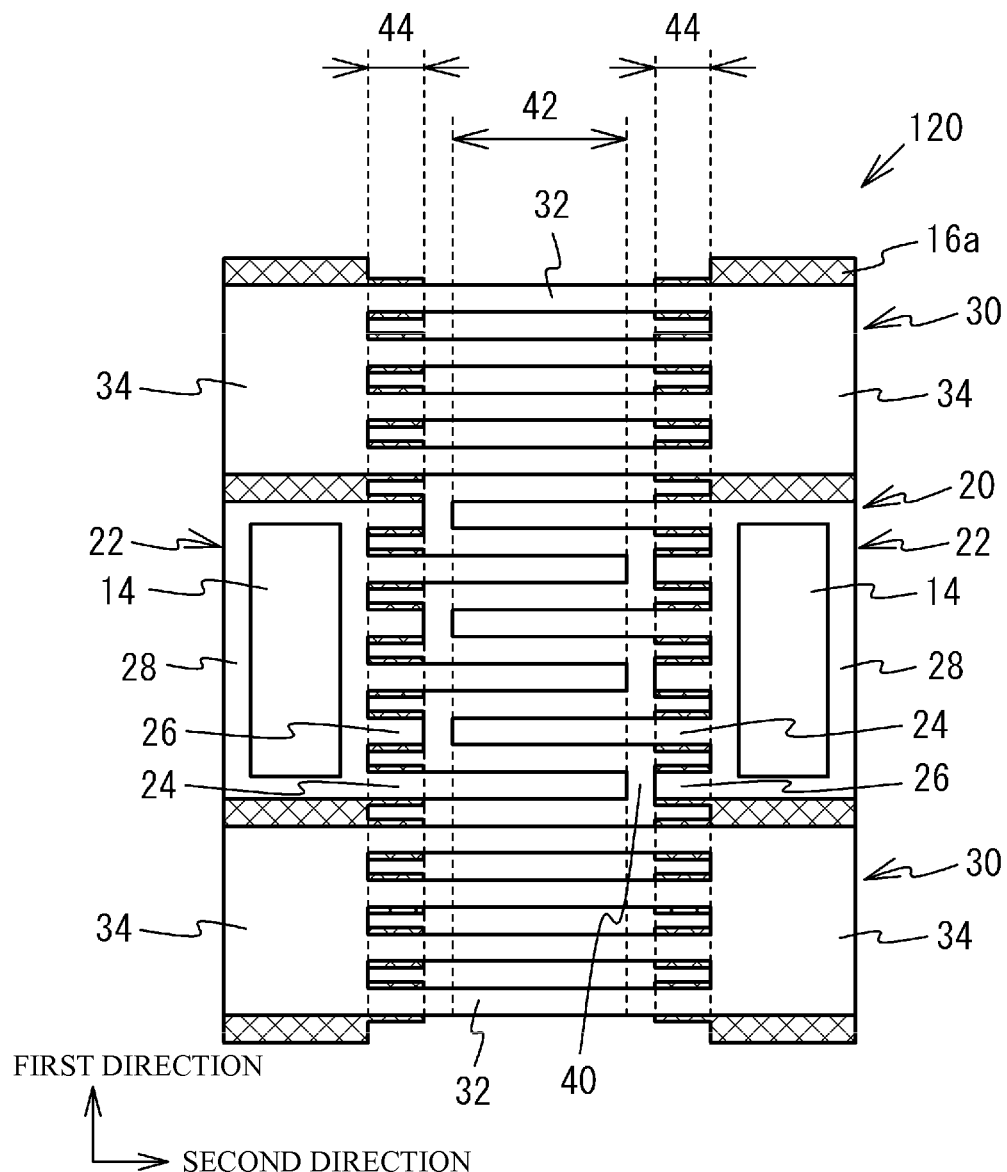
FIG. 6 illustrates a top view of a SAW device in accordance with a second modified embodiment of a first embodiment.

FIG. 6 illustrates a top view of a SAW device in accordance with a second modified embodiment of the first embodiment. As illustrated in FIG. 6, a SAW device 120 in accordance with the second modified embodiment of the first embodiment is different from the SAW device 100 of the first embodiment in a point of a shape of the added film in the first region 44. That is, in the first embodiment, as illustrated in FIG. 1A, the added film 16 in the first region 44 has a rectangular shape extending in the first direction in a linear fashion. On the other hand, in the second modified embodiment of the first embodiment, an added film 16a of the first region 44 projects under the electrode finger 24 and the dummy electrode finger 26 of the comb electrode 22 and under the electrode finger 32 of the reflector 30. And, the added film 16a has convexoconcave shape having recesses between the electrode finger 24 and the dummy electrode finger 26, between the electrode fingers 32, and between the electrode finger 24 or the dummy electrode finger 26 and the electrode finger 32. Other structures are the same as FIG. 1A of the first embodiment. Therefore, an explanation of the structures is omitted.

As in the case of the second modified embodiment of the first embodiment, there may be a portion without the added film 16a between the electrode finger 24 and the dummy electrode finger 26 of the first region 44. However, in order to suppress the leakage of the surface acoustic wave in the opening length direction effectively, it is preferable that the added film 16 extends to between the electrode finger 24 and the dummy electrode finger 26 in the first region 44 as illustrated in FIG. 1A. For example, it is preferable that the added film 16 extends to an entire region between the electrode finger 24 and the dummy electrode finger 26 of the first region 44.

In the second modified embodiment of the first embodiment, it is preferable that a plurality of edges of the added film 16a on the crossing extension region 42 side are located in the edge portion of the dummy electrode finger 26 and are arrayed in the first direction. It is therefore possible to suppress the leakage of the surface acoustic wave in the opening length direction effectively. The plurality of edges of the added film 16a on the crossing extension region 42 side may be off the edges of the dummy electrode finger 26 and may be arrayed in the first direction. The plurality of the edges of the added film 16a on the crossing extension region 42 side maybe arrayed in the first direction in a linear fashion. A part of the edges may be shifted toward the second direction and may be arrayed in the first direction.

In the second modified embodiment of the first embodiment, the added film 16a, the electrode finger 24 and the dummy electrode finger 26 may be formed off each other in the first direction in the manufacturing processes. In order to suppress the leakage of the surface acoustic wave in the opening length direction effectively, it is preferable that the added film 16a is provided in an entire region of the first direction of the electrode finger 24 and the dummy electrode finger 26. Therefore, it is preferable that a width of the added film 16a in the first direction in the first region 44 (in other words, a width of a convex portion of the added film 16a in the first direction) is larger than a width of the electrode finger 24 and the dummy electrode finger 26 in the first direction.

Second Embodiment

Figure 7A:
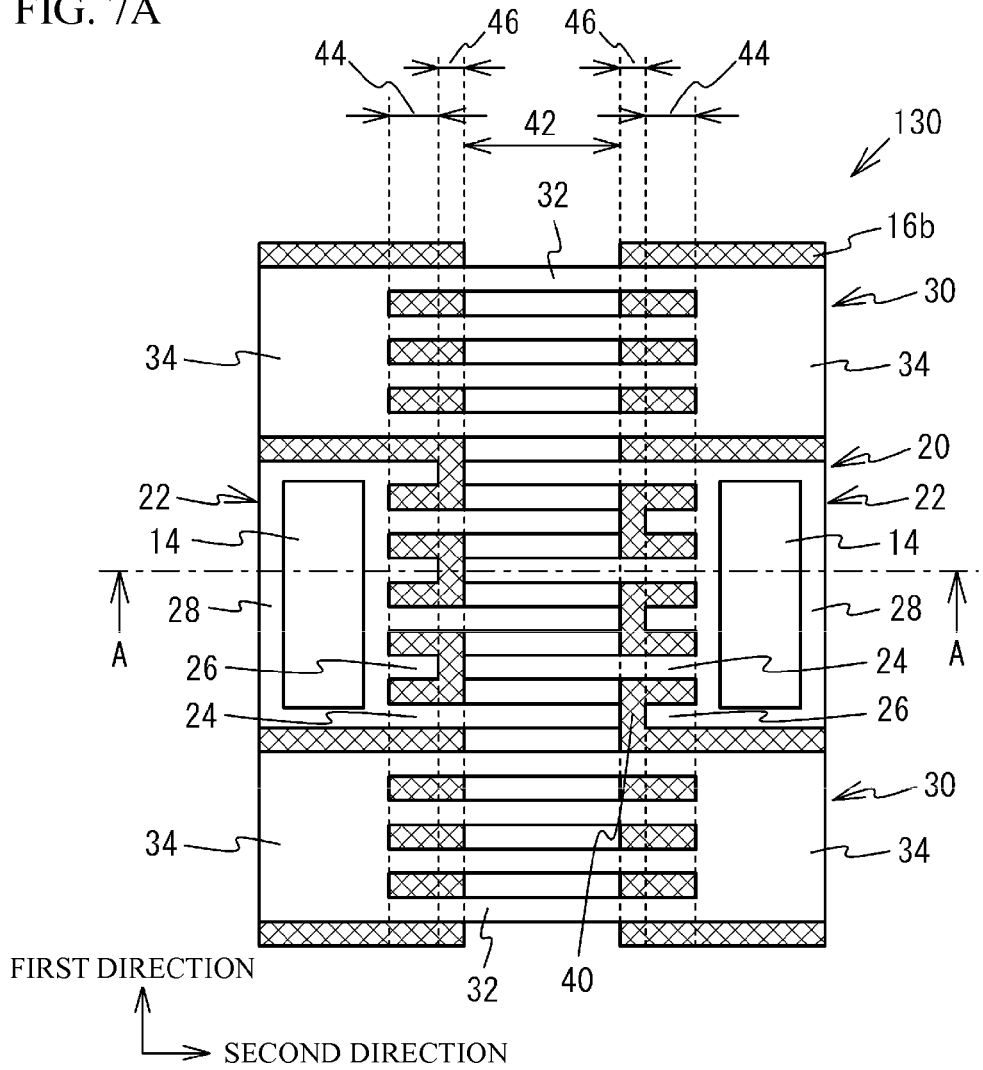
FIG. 7A illustrates a top view of a SAW device in accordance with a second embodiment.
Figure 7B:
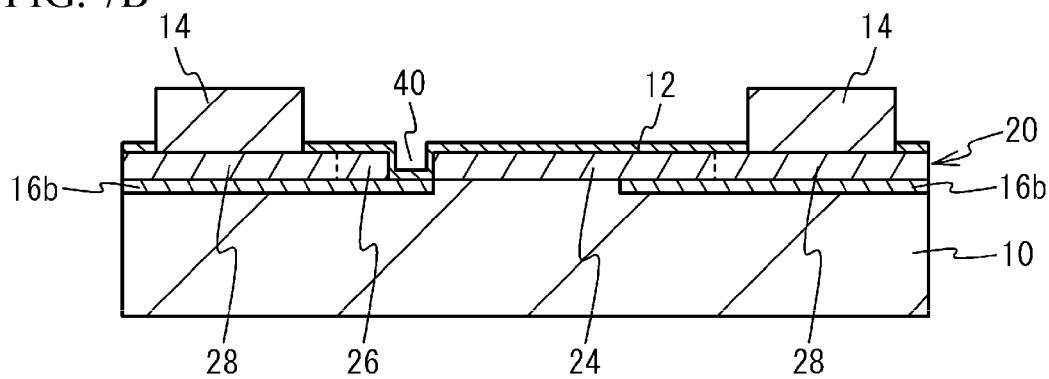
FIG. 7B illustrates a cross sectional view taken along a line A-A of FIG. 7A.

FIG. 7A illustrates a top view of a SAW device in accordance with a second embodiment. FIG. 7B illustrates a cross sectional view taken along a line A-A of FIG. 7A. As illustrated in FIG. 7A and FIG. 7B, in a SAW device 130 in accordance with the second embodiment, an added film 16b is provided between an edge of the bus bar 28 opposite to the connection of the dummy electrode finger 26 and an edge of the clearance 40 opposite to the electrode finger 24 and extends in the first direction from one of a pair of the reflectors 30 to the other. That is, when a region of the clearance 40 extending in the first direction is a second region 46, the added film 16b is also provided in the clearance 40 and under the electrode finger 24 of the comb electrode 22 in the second region 46 and under the electrode finger 32 of the reflector 30, being different from FIG. 1A of the first embodiment. Other structures are the same as FIG. 1A and FIG. 1B of the first embodiment. Therefore, an explanation of the structures is omitted.

Figure 8:
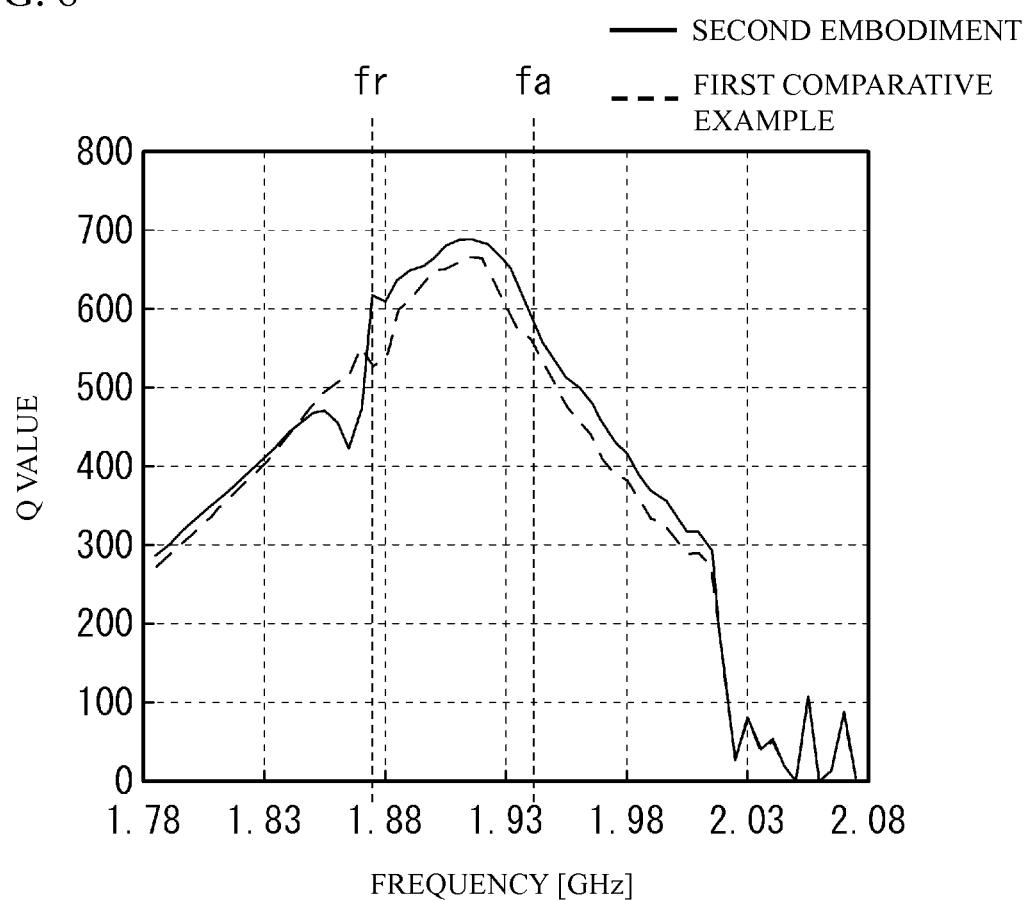
FIG. 8 illustrates a simulation result of a Q characteristic of a SAW device of a second embodiment.

FIG. 8 illustrates a simulation result of the Q characteristic of the SAW device of the second embodiment. A concrete structure of the SAW device of the second embodiment subjected to the simulation is the same as Table 1. In FIG. 8, a solid line indicates the simulation result. For comparison, a broken line indicates a simulation result of the first comparative example of FIG. 3. As illustrated in FIG. 8, in the second embodiment, there is a frequency smaller than the resonant frequency fr at which the Q value is deteriorated, compared to the first comparative example. However, the Q value is improved in a wide frequency band from the resonant frequency fr to a frequency higher than the anti-resonant frequency.

Figure 9:
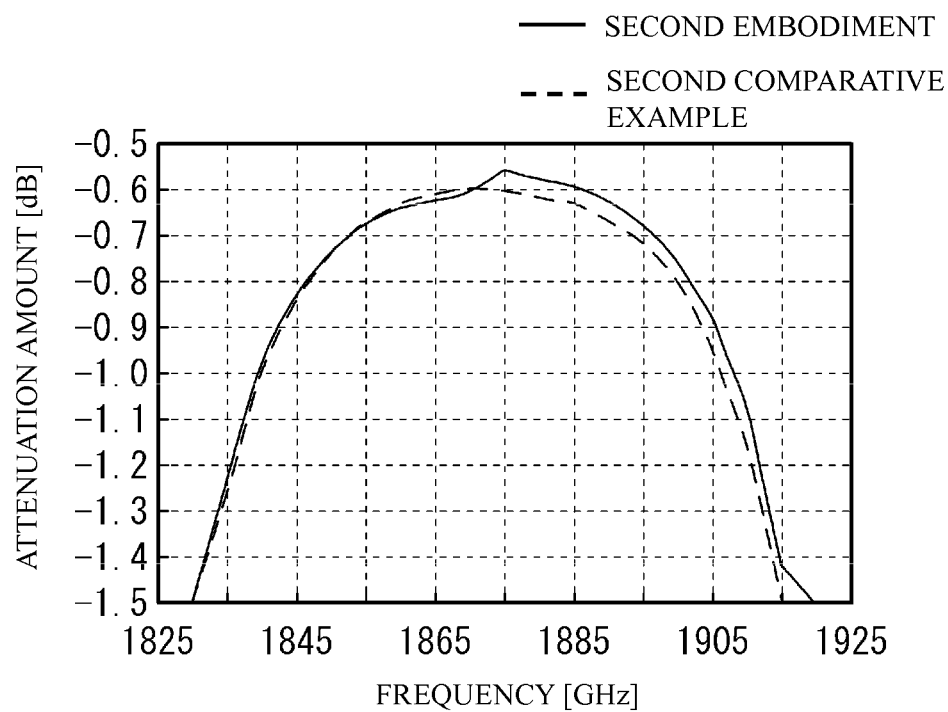
FIG. 9 illustrates a simulation result of a pass characteristic of a ladder type filter using a SAW device of a second embodiment.

FIG. 9 illustrates a simulation result of a pass characteristic of a ladder type filter using the SAW device of the second embodiment. The ladder type filter subjected to the simulation is a four-stage ladder type filter as well as the first embodiment. The number of pairs of the electrode fingers 24 of the IDT 20 is 116 in all series resonators. Other structures of the ladder type filter are the same as the SAW device of the second embodiment having the structure of Table 1. All parallel resonators are the SAW devices of the second embodiment having the structure of Table 1. In FIG. 9, a solid line indicates the simulation result of the ladder type filter using the SAW device of the second embodiment. For comparison, a broken line indicates the simulation result of the ladder type filter of the second comparative example of FIG. 4. As illustrated in FIG. 9, in the second embodiment, there is little changing in the pass characteristic on the low frequency side in the pass band. However, the insertion loss is improved on the high frequency side in the pass band.

As in the case of the second embodiment, the added film 16b may extend under the clearance 40 and under the electrode finger 24 of the second region 46. In this case, it is also possible to suppress the leakage of the surface acoustic wave propagating in the crossing region to outside of the crossing region in the opening length direction. As a result, the Q value can be improved as illustrated in FIG. 8. When the SAW device of the second embodiment is used as the ladder type filter, it is possible to improve the insertion loss in the pass band as illustrated in FIG. 9.

It is preferable that the edge of the added film 16b on the crossing extension region 42 side is located in the edge portion of the clearance 40 on the electrode finger 24 side and the added film 16b extends in the first direction. The edge of the added film 16b on the crossing extension region 42 side may be located on the dummy electrode finger 26 side with respect to the edge of the clearance 40 on the electrode finger 24 side, and the added film 16b may extend in the first direction. That is, the added film 16b may be provided in an entire region of the clearance 40. The added film 16b may be provided only in a part of the clearance 40.

Figure 10:
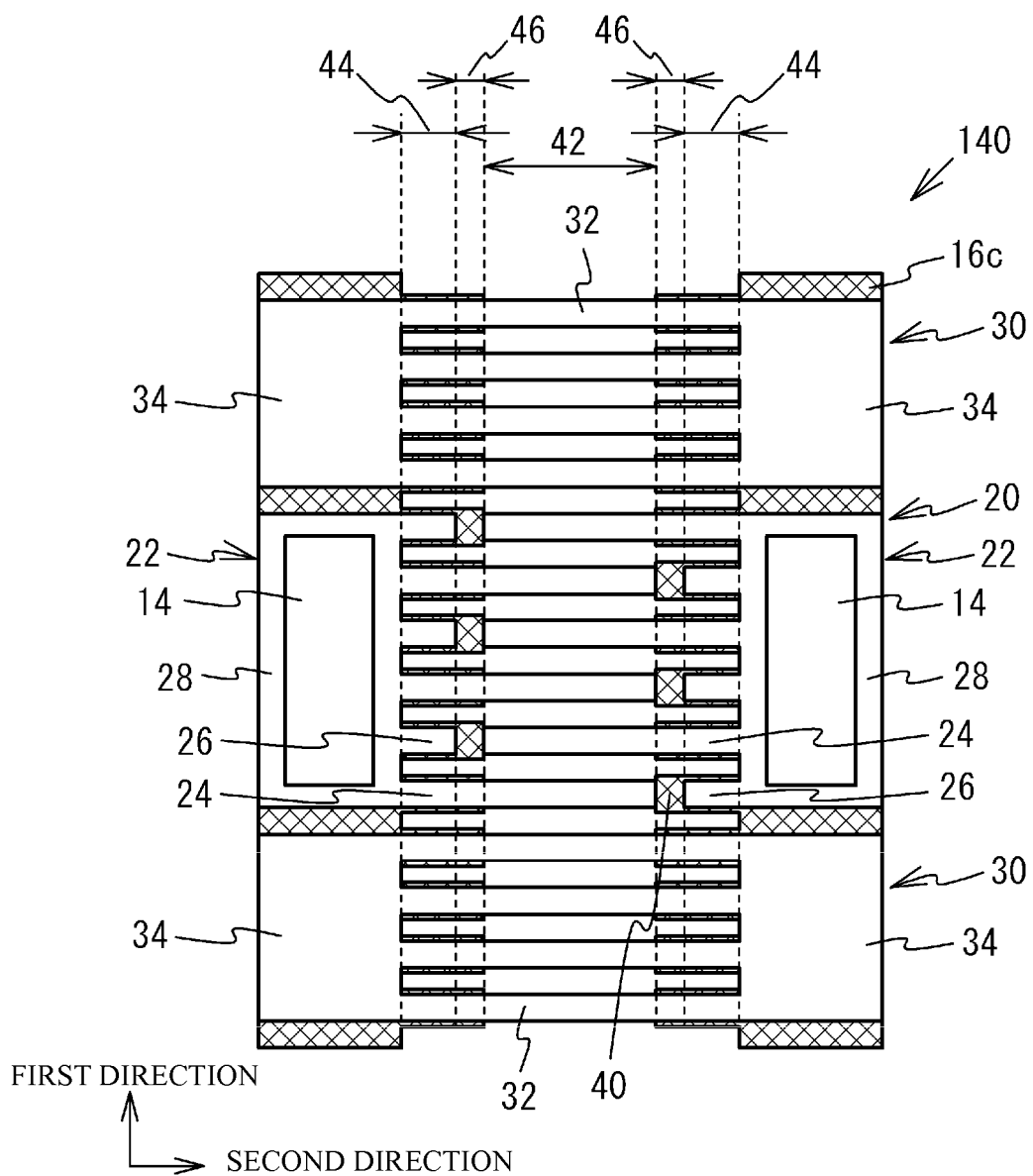
FIG. 10 illustrates a top view of a SAW device in accordance with a first modified embodiment of a second embodiment.

FIG. 10 illustrates a top view of a SAW device in accordance with a first modified embodiment of the second embodiment. As illustrated in FIG. 10, in a SAW device 140 of the first modified embodiment of the second embodiment, the shape of the added film from the first region 44 to the second region 46 is different from that of the SAW device 130 of the second embodiment. That is, in the second embodiment, as illustrated in FIG. 7A, the added film 16b from the first region 44 to the second region 46 has a rectangular shape extending in the first direction in a linear fashion. On the other hand, in the first modified embodiment of the second embodiment, an added film 16c from the first region 44 to the second region 46 projects under the electrode finger 24 and the dummy electrode finger 26 of the comb electrode 22 and under the electrode finger 32 of the reflector 30 and has a convexoconcave shape having a recess between the electrode finger 24 and the dummy electrode finger 26, between the electrode fingers 32 and between the electrode finger 24 or the dummy electrode finger 26 and the electrode finger 32. Other structures are the same as FIG. 7A of the second embodiment. Therefore, an explanation of the other structures is omitted.

As in the case of the first modified embodiment of the second embodiment, there is a portion without the added film 16c between the electrode finger 24 and the dummy electrode finger 26 of the first region 44 and between the electrode finger 24 and the clearance 40 of the second region 46. However, in order to suppress the leakage of the surface acoustic wave in the opening length direction effectively, it is preferable that the added film 16b extends between the electrode finger 24 and the dummy electrode finger 26 of the first region 44 and between the electrode finger 24 and the clearance 40 of the second region 46 as illustrated in FIG. 7A. For example, it is preferable that the added film 16b extends in an entire region between the electrode finger 24 and the dummy electrode finger 26 of the first region 44 and in an entire region between the electrode finger 24 and the clearance 40 of the second region 46.

In the first modified embodiment of the second embodiment, the added film 16c may be provided in an entire region of the clearance 40 or may be provided in only a part of the clearance 40, as in the case of the second embodiment. That is, a plurality of edges of the added film 16c on the crossing extension region 42 side may be located in the edge portion of the clearance 40 on the electrode finger 24 side and may be arrayed in the first direction. The plurality of edges of the added film 16c on the crossing extension region 42 side may be located on the dummy electrode finger 26 side with respect to the edge of the clearance 40 on the electrode finger 24 side and may be arrayed in the first direction. The plurality of edges of the added film 16c on the crossing extension region 42 side may be arrayed in a linear fashion in the first direction. At least one of the edges may be off toward the second direction and may be arrayed in the first direction. Moreover, in order to secure a margin of positional shift, it is preferable that a width of the added film 16c from the first region 44 to the second region 46 is larger than widths of the electrode finger 24 and the dummy electrode finger 26 in the first direction.

Third Embodiment

Figure 11:
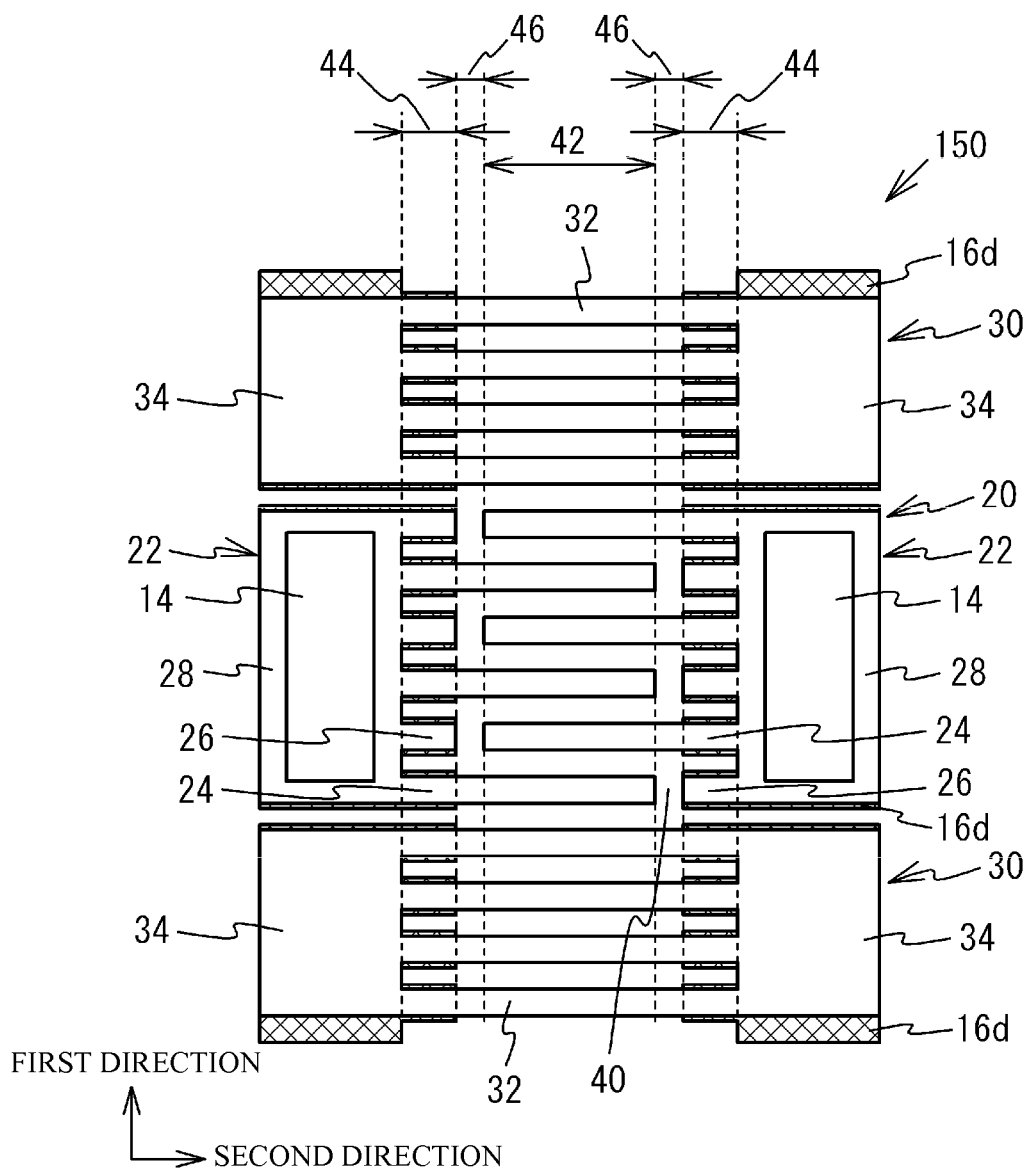
FIG. 11 illustrates a top view of a SAW device in accordance with a third embodiment.

A third embodiment is an example where an added film is not a dielectric film but a metal film. FIG. 11 illustrates a top view of a SAW device in accordance with a third embodiment. As illustrated in FIG. 11, a SAW device 150 of the third embodiment has a structure in which an added film 16d provided under the IDT 20 is separated from another added film 16d provided under the reflector 30. This is because the added film 16d is a metal film and the IDT 20 is electrically connected to the reflector 30 when the added film 16d under the IDT 20 is not separated from the added film 16d under the reflector 30. Other structures are the same as FIG. 6 of the second modified embodiment of the first embodiment. Therefore, an explanation of the structures is not omitted.

Through a simulation, the present inventors measured the Q characteristic of two SAW devices of the third embodiment in which metal materials of the added film 16*d* are different from each other. Concrete structures of the SAW devices (samples 1 and 2) subjected to the simulation are shown in Table 2.

TABLE 2

|  | Sample 1 | Sample 2 |
|---|---|---|
| piezoelectric substrate | 42° Y-X LiTaO$_3$ | 42° Y-X LiTaO$_3$ |
| wavelength of acoustic wave | λ | λ |
| material and thickness of IDT | Al 0.0883 h/λ | Al 0.0883 h/λ |
| material and thickness of added film | Cu 0.01 h/λ | Al 0.01 h/λ |
| number of pairs of electrode fingers | 80 | 80 |
| number of electrode fingers of reflector | 30 | 30 |
| opening length | 17.6λ | 17.6 λ |
| length of dummy electrode fingers | 2.0λ | 2.0 λ |
| duty ratio | 50% | 50% |

As shown in Table 2, in the sample 1, a copper (Cu) film having a film thickness of 0.01λ is used as the added film 16*d*. In the sample 2, an aluminum (Al) film having a film thickness of 0.01λ is used as the added film 16*d*. Other structures are the same as Table 1 of the first embodiment. Therefore, an explanation of the structures is omitted.

Figure 12:
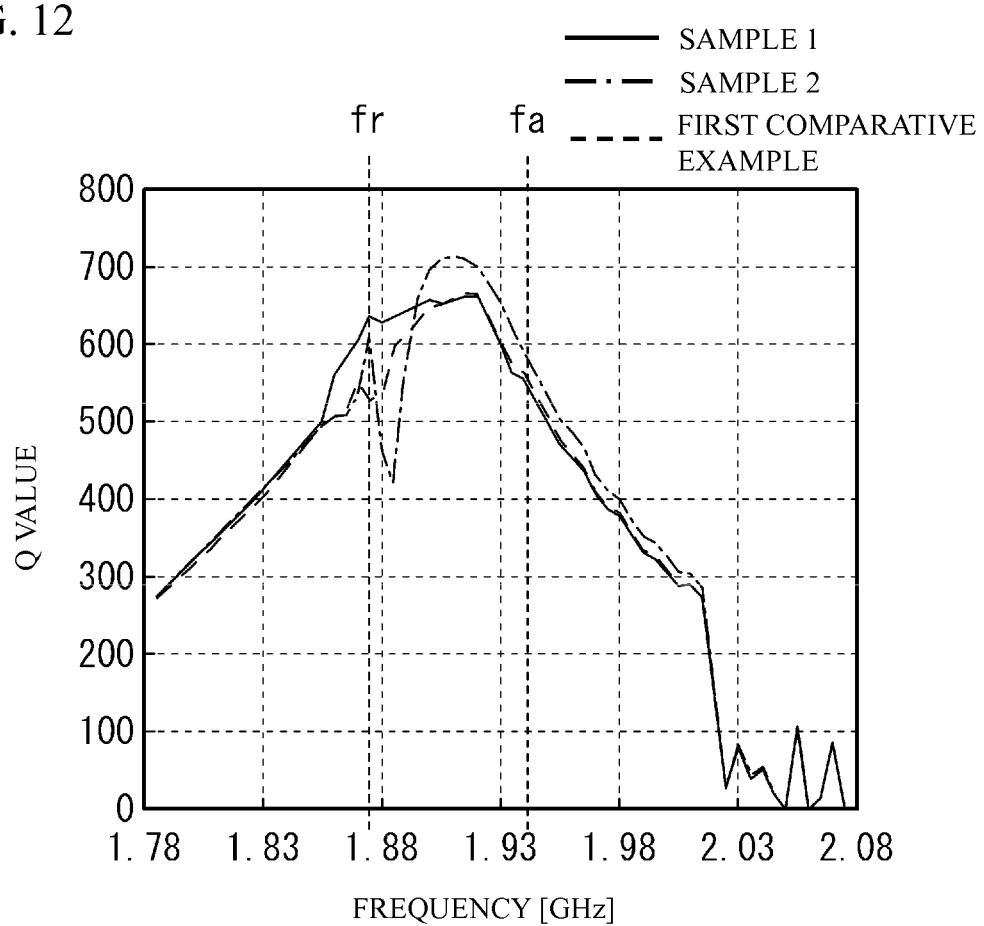
FIG. 12 illustrates a simulation result of a Q characteristic of a SAW device of a third embodiment.

FIG. 12 illustrates a simulation result of the Q characteristic of the SAW devices of the third embodiment (samples 1 and 2). In FIG. 12, a solid line indicates the simulation result of the sample 1. A dashed line indicates the simulation result of the sample 2. For comparison, a broken line indicates the simulation result of the first comparative example of FIG. 3. As illustrated in FIG. 12, the Q value of the sample 1 is improved more than that of the first comparative example near the resonant frequency fr. The Q value of the sample 1 is substantially the same as that of the first comparative example in the other frequency range. The Q value of the sample 2 is deteriorated more than that of the first comparative example near the resonant frequency fr between the resonant frequency fr and the anti-resonant frequency fa. However, the Q value of the sample 2 is improved more than that of the first comparative example in the other frequency range. It is thought that the difference of the metal materials (Cu and Al) of the added film 16*d* results in the difference of the Q characteristic, because of the difference of the mass load effects of the added film 16*d* and/or the sound impedances of the metal materials.

Next, the preset inventors measured a pass characteristic of ladder type filters using the SAW devices (samples 1 and 2) of the third embodiment. The ladder type filters used for the simulation are four-stage ladder type filters as well as the first embodiment. The simulation was performed with respect to three ladder type filters (samples 3 to 5). The ladder type filter of the sample 3 has series resonators, all of which are different from the SAW device of the third embodiment having the structure of the sample 1 of Table 2 only in a point that the number of the pairs of the electrode fingers 24 of the IDT 20 of the series resonators is 116. The ladder type filter of the sample 3 has parallel resonators, all of which are the SAW devices of the third embodiment having the structure of the sample 1 of Table 2. The ladder type filter of the sample 4 has series resonators, all of which are different from the SAW device of the third embodiment having the structure of the sample 2 of Table 2 only in a point that the number of the pairs of the electrode fingers 24 of the IDT 20 of the series resonators is 116. The ladder type filter of the sample 4 has parallel resonators, all of which are the SAW devices of the third embodiment having the structure of the sample 2 of Table 2. The ladder type filter of the sample 5 has series resonators, all of which are different from the SAW device of the third embodiment having the structure of Table 2 only in points that the number of the pairs of the electrode fingers 24 of the IDT 20 of the series resonators is 116 and the added film 16*d* is not provided. The ladder type filter of the sample 5 has parallel resonators, all of which are the SAW devices of the third embodiment having the structure of the sample 2 of Table 2.

Figure 13:
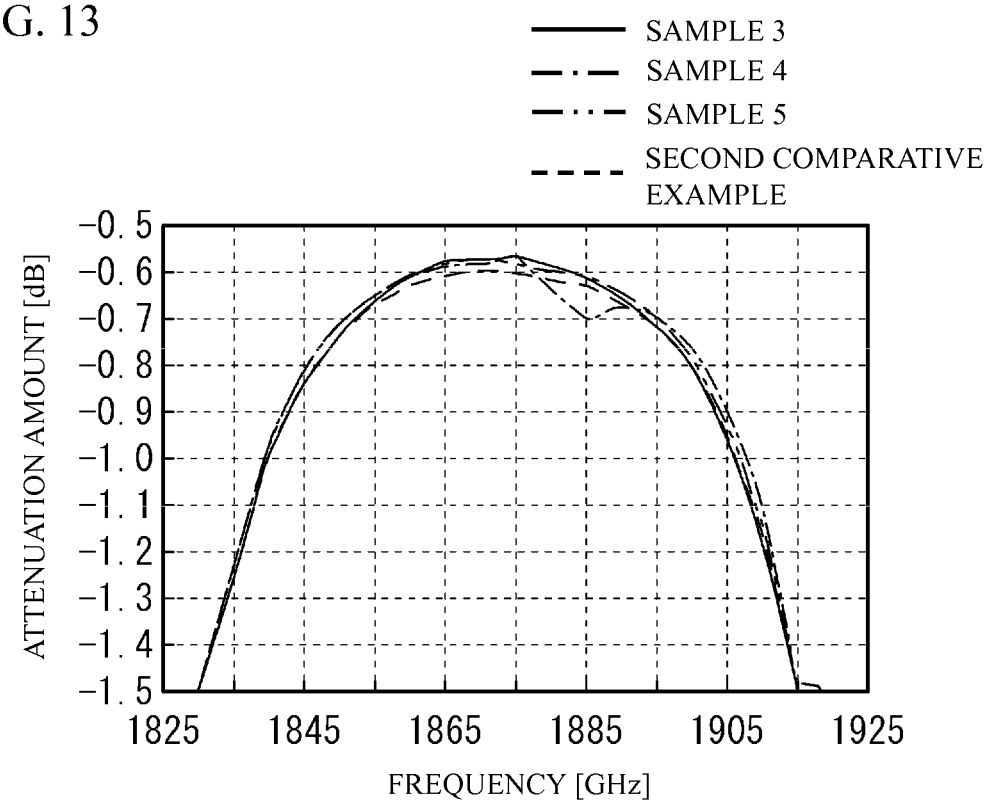
FIG. 13 illustrates a simulation result of a pass characteristic of a ladder type filter using a SAW device of a third embodiment.

FIG. 13 illustrates the simulation results of the pass characteristic of the ladder type filters (samples 3 to 5) using the SAW device of the third embodiment. A solid line indicates the simulation result of the sample 3. A dashed line indicates the simulation result of the sample 4. A dashed two-dotted line indicates the simulation result of the sample 5. For comparison, a broken line indicates the simulation result of the second comparative example of FIG. 4. As illustrated in FIG. 13, the insertion loss of the sample 3 is improved more than that of the second comparative example in an entire range of the pass band. The loss of the sample 4 is deteriorated more than that of the second comparative example in a center portion of the pass band. However, the insertion loss is improved in the other range of the pass band. The insertion loss of the sample 5 is improved more than that of the second comparative example in the entire range of the pass band.

The insertion loss of the sample 3 is improved in the entire range of the pass band. On the other hand, the loss of the sample 4 is deteriorated in the center portion of the pass band. It is thought that the reasons are as follows. That is, the series resonators contribute to the pass characteristic on the high frequency side in the pass band of the ladder type filter. The parallel resonators contribute to the pass characteristic on the lower frequency side in the pass band of the ladder type filter. Therefore, the Q characteristic near the resonant frequency fr of the series resonators and the Q characteristic near the anti-resonant frequency fa of the parallel resonators contribute to the insertion loss of the pass band of the ladder type filter. The SAW device of the sample 1 used for the series resonators and the parallel resonators has the Q value higher than that of the first comparative example in the entire range from the resonant frequency fr to the anti-resonant frequency fa as illustrated in FIG. 12. It is therefore thought that the insertion loss of the sample 3 is improved in the entire range of the pass band. On the other hand, the SAW device of the sample 2 used for the series resonators and the parallel resonators of the sample 4 has the Q value that is deteriorated near the resonant frequency fr as illustrated in FIG. 12. It is therefore thought that the deterioration of the loss occurs in the center portion of the pass band. In the sample 5, the SAW device of the sample 2 is used for only the parallel resonators. And, the series resonators of the sample 5 do not use the SAW device of the sample 2. It is therefore thought that the insertion loss is improved in the entire range of the pass band.

As in the case of the third embodiment, a metal film may be used as the added film 16*d*, and the added film 16*d* under the comb electrode 22 may be separated from the added film 16*d* under the reflector 30. In this case, it is also possible to suppress the leakage of the surface acoustic wave propagating in the crossing region to outside of the crossing region in the opening length direction. Thereby, it is possible to improve the Q value as illustrated in FIG. 12. When the SAW device of the third embodiment is used as the ladder type filter, it is possible improve the insertion loss of the pass band as illustrated in FIG. 13.

In the third embodiment, the added film 16d may be a dielectric film as in the case of the first embodiment and the second embodiment. When a dielectric film is used as an added film, the added film may be a film including one of a silicon oxide ($SiO_2$) film, a tantalum oxide ($Ta_2O_5$) film, an aluminum oxide ($Al_2O_3$) film, a silicon nitride (SiN) film, a tantalum nitride (TaN) film and a silicon carbide (SiC) film.

In the first embodiment, the first modified embodiment of the first embodiment, the second embodiment and the first modified embodiment of the second embodiment, added films may be metal films when an added film under the comb electrode 22 is separated from an added film under the reflector 30. However, in the first embodiment (FIG. 1A and FIG. 1B) and the second embodiment (FIG. 7A and FIG. 7B), when the added film is a metal film, the effect of the dummy electrode finger is degraded. It is therefore preferable that the added film is a dielectric film. When the added film is a metal film, the added film, for example, may be a metal film including one of a copper (Cu) film, an aluminum (Al) film, a titanium (Ti) film and a gold (Au) film. When the added film is a metal film, in the comb electrode 22, the thickness of the metal film in the regions of the bus bar 28 and the electrode finger 24 and the dummy electrode finger 26 of the first region 44, in which the added film is provided, is larger than the thickness of the electrode finger 24 of the crossing extension region 42.

It is preferable that the added film is provided under the entire region of the plurality of the electrode fingers 24 and the plurality of the dummy electrode fingers 26 of the first region 44 in the first embodiment to the third embodiment. The added film may be provided under a part of the plurality of the electrode fingers 24 and the plurality of the dummy electrode fingers 26 of the first region 44.

Fourth Embodiment

Figure 14:
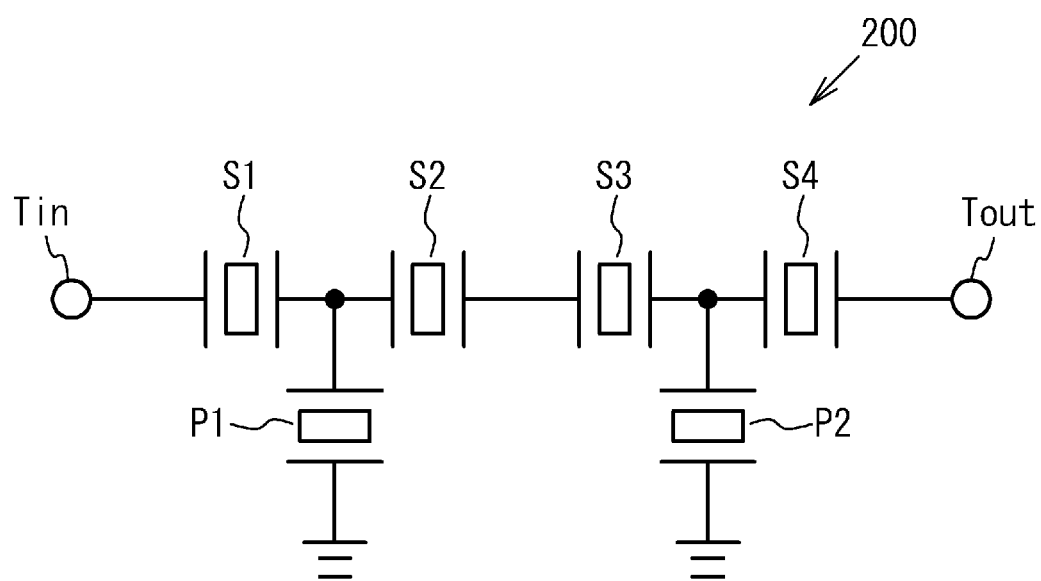
FIG. 14 illustrates a circuit diagram of a ladder type filter in accordance with a fourth embodiment.

A fourth embodiment is an example in which the SAW devices of the first embodiment to the third embodiment is used as a filter. FIG. 14 illustrates a circuit diagram of a ladder type filter in accordance with the fourth embodiment. As illustrated in FIG. 14, a ladder type filter 200 in accordance with the fourth embodiment has a plurality of series resonators S1 to S4 that are connected in series between the input terminal Tin and the output terminal Tout and a plurality of parallel resonators P1 and P2 that are connected in parallel between the input terminal Tin and the output terminal Tout. That is, the ladder type filter 200 of the fourth embodiment is a four-stage ladder type filter. At least one of the series resonators S1 to S4 and the parallel resonators P1 and P2 may be one of the SAW devices of the first embodiment to the third embodiment. For example, in terms of the Q characteristic of the SAW device, all of the series resonators S1 to S4 and the parallel resonators P1 and P2 may be one of the SAW devices of the first embodiment to the third embodiment. One group of the series resonators S1 to S4 and the parallel resonators P1 and P2 may be the SAW devices of the first embodiment to the third embodiment.

As in the case of the fourth embodiment, when the SAW devices of the first embodiment to the third embodiment are used as the ladder type filter, the insertion loss of the pass band can be improved as illustrated in FIG. 4, FIG. 9 and FIG. 13. In the fourth embodiment, the four-stage ladder type filter is described. A ladder type filter of which number of stages is different from 4 may be used. A filter that is different from the ladder type filter such as a lattice type filter may be used.

The present invention is not limited to the specifically described embodiments, but other embodiments and variations may be made without departing from the scope of the claimed invention.

What is claimed is:

1. A surface acoustic wave device comprising:
a pair of comb electrodes that are provided on a piezoelectric substrate, and that respectively has a plurality of electrode fingers, a plurality of dummy electrode fingers and a bus bar to which the plurality of the electrode fingers and the plurality of the dummy electrode fingers are connected, edges of the plurality of the electrode fingers of one of the comb electrodes respectively facing the plurality of the dummy electrode fingers of the other; and
an added film that is provided at least under the bus bar of the pair of the comb electrodes and under the plurality of the electrode fingers and the plurality of the dummy electrode fingers in a first region and is not provided in a crossing region where the plurality of the electrode fingers of the one of the comb electrodes and the plurality of the electrode fingers of the other cross each other, the first region being a region between front edges of the plurality of the dummy electrode fingers and edges of the plurality of the dummy electrode fingers connected to the bus bar and extending in an alignment direction of the plurality of the electrode fingers,
wherein a region between the electrode fingers and the dummy electrode fingers in the first region have a portion without the added film.

2. The surface acoustic wave device as claimed in claim 1, wherein the added film is buried in a recess of an upper face of the piezoelectric substrate.

3. The surface acoustic wave device as claimed in claim 1, wherein the added film is provided in clearances between the front edges of the plurality of the electrode fingers and corresponding front edges of the plurality of the dummy electrode fingers and extends under the plurality of the electrode fingers in a second region in which the clearances extend in the alignment direction of the plurality of the electrode fingers.

4. The surface acoustic wave device as claimed in claim 1 further comprising reflectors that are provided on both sides of the pair of the comb electrodes in the alignment direction of the plurality of the electrode fingers,
wherein the added film is also provided under bus bars of the reflectors and under electrode fingers of the reflectors in the first region.

5. The surface acoustic wave device as claimed in claim 4, wherein the added film under the pair of the comb electrodes is separated from the added film under the reflectors.

6. The surface acoustic wave device as claimed in claim 1, wherein the added film is made of a dielectric film including one of an $SiO_2$ film, a $Ta_2O_5$ film, an $Al_2O_3$ film, a SiN film, a TaN film and a SiC film.

7. The surface acoustic wave device as claimed in claim 1, wherein:
the added film is made of a metal film including one of a Cu film, an Al film, a Ti film and an Au film; and
in the pair of the comb electrodes, a thickness of a metal film consisting of the added film and the bus bar in a region of the bus bar is larger than a thickness of the plurality of the electrode fingers of the crossing region, and a thickness of a metal film consisting of the added film and the electrode fingers or the dummy electrode fingers in the first region is larger than a thickness of the plurality of the electrode fingers of the crossing region.

8. A filter comprising a surface acoustic wave device having the surface acoustic wave device as claimed in claim 1.

9. A surface acoustic wave device comprising:
a pair of comb electrodes that are provided on a piezoelectric substrate, and that respectively has a plurality of electrode fingers, a plurality of dummy electrode fingers and a bus bar to which the plurality of the electrode fingers and the plurality of the dummy electrode fingers are connected, edges of the plurality of the electrode fingers of one of the comb electrodes respectively facing the plurality of the dummy electrode fingers of the other; and
an added film that is provided at least under the bus bar of the pair of the comb electrodes and under the plurality of the electrode fingers and the plurality of the dummy electrode fingers in a first region and is not provided in a crossing region where the plurality of the electrode fingers of the one of the comb electrodes and the plurality of the electrode fingers of the other cross each other, the first region being a region between front edges of the plurality of the dummy electrode fingers and edges of the plurality of the dummy electrode fingers connected to the bus bar and extending in an alignment direction of the plurality of the electrode fingers,
wherein the added film is buried in a recess of an upper face of the piezoelectric substrate.

10. A surface acoustic wave device comprising:
a pair of comb electrodes that are provided on a piezoelectric substrate, and that respectively has a plurality of electrode fingers, a plurality of dummy electrode fingers and a bus bar to which the plurality of the electrode fingers and the plurality of the dummy electrode fingers are connected, edges of the plurality of the electrode fingers of one of the comb electrodes respectively facing the plurality of the dummy electrode fingers of the other;
an added film that is provided at least under the bus bar of the pair of the comb electrodes and under the plurality of the electrode fingers and the plurality of the dummy electrode fingers in a first region and is not provided in a crossing region where the plurality of the electrode fingers of the one of the comb electrodes and the plurality of the electrode fingers of the other cross each other, the first region being a region between front edges of the plurality of the dummy electrode fingers and edges of the plurality of the dummy electrode fingers connected to the bus bar and extending in an alignment direction of the plurality of the electrode fingers; and
reflectors that are provided on both sides of the pair of the comb electrodes in the alignment direction of the plurality of the electrode fingers,
wherein the added film is also provided under bus bars of the reflectors and under electrode fingers of the reflectors in the first region.

* * * * *